United States Patent
Sugizaki et al.

(10) Patent No.: US 8,841,656 B2
(45) Date of Patent: Sep. 23, 2014

(54) ORGANIC ELECTROLUMINESCENT ELEMENT, LIGHTING APPARATUS, AND METHOD FOR MANUFACTURING ORGANIC ELECTROLUMINESCENT ELEMENT

(75) Inventors: Tomoko Sugizaki, Kanagawa-ken (JP); Shintaro Enomoto, Kanagawa-ken (JP); Akio Amano, Tokyo (JP); Tomio Ono, Kanagawa-ken (JP); Yasushi Shinjo, Kanagawa-ken (JP); Yukitami Mizuno, Tokyo (JP); Keiji Sugi, Kanagawa-ken (JP); Tomoaki Sawabe, Tokyo (JP); Toshiya Yonehara, Kanagawa-ken (JP); Daimotsu Kato, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 215 days.

(21) Appl. No.: 13/613,457

(22) Filed: Sep. 13, 2012

(65) Prior Publication Data
US 2013/0248825 A1 Sep. 26, 2013

(30) Foreign Application Priority Data
Mar. 22, 2012 (JP) .................. 2012-066415

(51) Int. Cl.
*H01L 35/24* (2006.01)
(52) U.S. Cl.
USPC ..................... 257/40; 257/E51.001

(58) Field of Classification Search
USPC ............................. 257/40, E51.001
See application file for complete search history.

(56) References Cited

FOREIGN PATENT DOCUMENTS

JP 2011-23336 2/2011

OTHER PUBLICATIONS

U.S. Appl. No. 14/045,133, filed Oct. 3, 2013, Ono, et al.
U.S. Appl. No. 14/077,644, filed Nov. 12, 2013, Sawabe, et al.

*Primary Examiner* — Anthony Ho
(74) *Attorney, Agent, or Firm* — Oblon, Spivak, McClelland, Maier & Neustadt, L.L.P.

(57) ABSTRACT

According to one embodiment, an organic electroluminescent element includes: a first electrode having a first and a second major surfaces; a second electrode opposed to part of the first major surface; an organic luminescent layer provided between the first and the second electrodes; an optical layer having a third major surface opposed to the second major surface and a fourth major surface on opposite side from the third major surface. The fourth major surface includes a first region overlapping the second electrode, and a second region not overlapping the second electrode. The fourth major surface includes a first concave-convex provided in the first region and a second concave-convex provided in the second region. A planarization layer is provided on the second region and burying the second concave-convex.

20 Claims, 7 Drawing Sheets

ORGANIC ELECTROLUMINESCENT ELEMENT, LIGHTING APPARATUS, AND METHOD FOR MANUFACTURING ORGANIC ELECTROLUMINESCENT ELEMENT

CROSS-REFERENCE TO RELATED APPLICATIONS

This application is based upon and claims the benefit of priority from the prior Japanese Patent Application No. 2012-066415, filed on Mar. 22, 2012; the entire contents of which are incorporated herein by reference.

FIELD

Embodiments described herein relate generally to an organic electroluminescent element, a lighting apparatus, and a method for manufacturing organic electroluminescent element.

BACKGROUND

Recently, organic electroluminescent elements have been drawing attention in applications such as surface light sources. In the organic electroluminescent element, an organic thin film is provided between two electrodes. A current is applied to the organic thin film to inject electrons and holes, which are then recombined to generate excitons. Luminescence resulting from radiative deactivation of this exciton is utilized.

The organic electroluminescent element has such features as thinness, light weight, and surface emission, and hence has raised expectations for applications yet to be realized by existing lighting fixtures and light sources.

DETAILED DESCRIPTION

Figure 1:
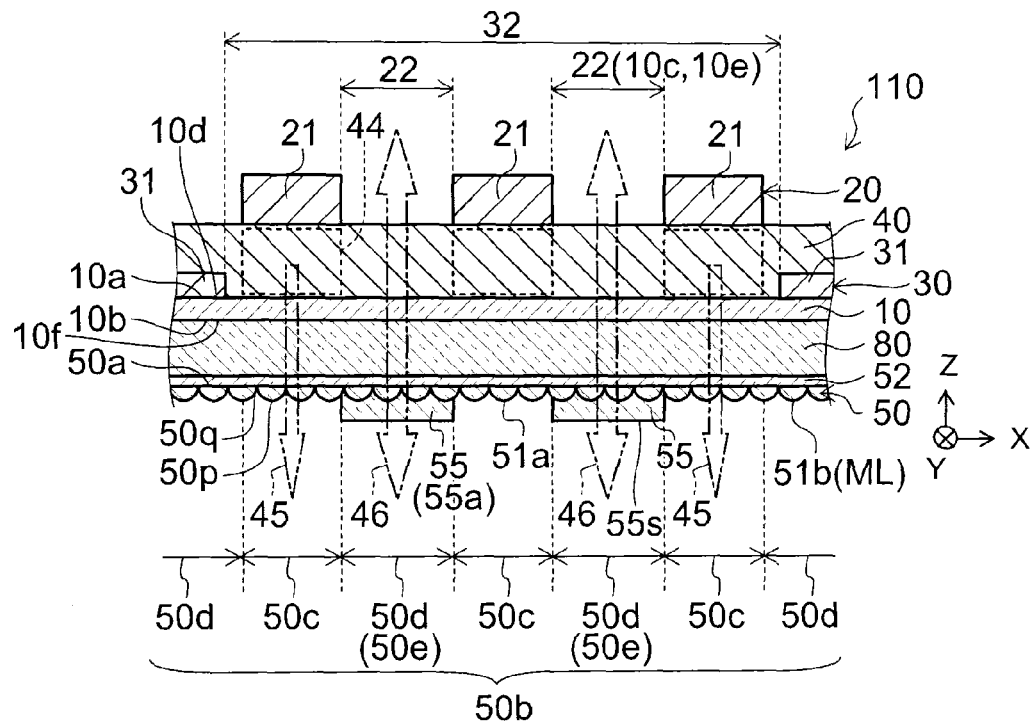
FIG. 1 is a schematic sectional view illustrating the configuration of an organic electroluminescent element according to a first embodiment.

In general, according to one embodiment, an organic electroluminescent element includes: a first electrode having a first major surface and a second major surface on opposite side from the first major surface and having optical transparency; a second electrode opposed to part of the first major surface; an organic luminescent layer provided between the first electrode and the second electrode; an optical layer having a third major surface opposed to the second major surface and a fourth major surface on opposite side from the third major surface and having optical transparency, the fourth major surface including a first region overlapping the second electrode and a second region not overlapping the second electrode as projected on a plane parallel to the first major surface, and the fourth major surface including a first concave-convex provided in the first region and a second concave-convex provided in the second region; and a planarization layer provided on the second region and burying the second concave-convex.

In general, according to another embodiment, a lighting apparatus includes: an organic electroluminescent element including: a first electrode having a first major surface and a second major surface on opposite side from the first major surface and having optical transparency; a second electrode opposed to part of the first major surface; an organic luminescent layer provided between the first electrode and the second electrode; an optical layer having a third major surface opposed to the second major surface and a fourth major surface on opposite side from the third major surface and having optical transparency, the fourth major surface including a first region overlapping the second electrode and a second region not overlapping the second electrode as projected on a plane parallel to the first major surface, and the fourth major surface including a first concave-convex provided in the first region and a second concave-convex provided in the second region; and a planarization layer provided on the second region and burying the second concave-convex; and a power supply section electrically connected to the first electrode and the second electrode and supplying current to the organic luminescent layer through the first electrode and the second electrode.

In general, according to another embodiment, a method for manufacturing an organic electroluminescent element, includes: forming a planarization layer on a workpiece, the workpiece including a first electrode, a second electrode, an organic luminescent layer, and an optical layer, the first electrode having optical transparency and having a first major surface and a second major surface on opposite side from the first major surface, the second electrode being opposed to part of the first major surface, the organic luminescent layer being provided between the first electrode and the second electrode, the optical layer having optical transparency and having a third major surface opposed to the second major surface and a fourth major surface on opposite side from the third major surface, the fourth major surface including a first region overlapping the second electrode and a second region not overlapping the second electrode as projected on a plane parallel to the first major surface, and the fourth major surface including a first concave-convex provided in the first region and a second concave-convex provided in the second region, the forming including forming the planarization layer burying the second concave-convex on the second region by processing the workpiece based on light exposure using the second electrode as a mask.

Embodiments will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

(First Embodiment)

FIG. 1 is a schematic sectional view illustrating the configuration of an organic electroluminescent element according to a first embodiment.

Figure 2:
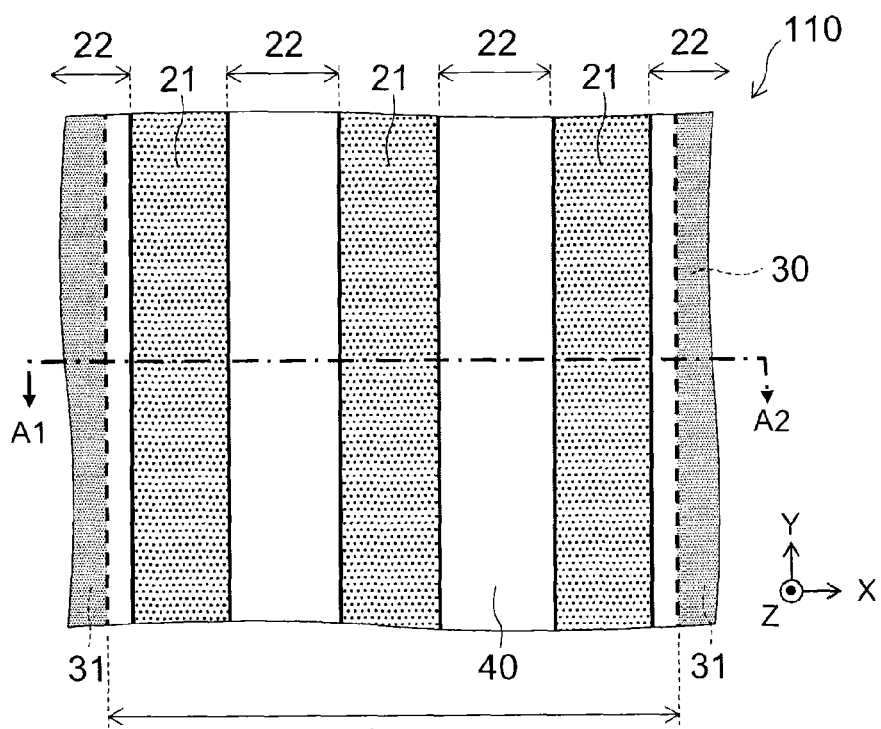
FIG. 2 is a schematic plan view illustrating the configuration of the organic electroluminescent element according to the first embodiment.

FIG. 2 is a schematic plan view illustrating the configuration of the organic electroluminescent element according to the first embodiment. FIG. 1 is a sectional view taken along line A1-A2 of FIG. 2.

In the views illustrated in these figures, part of the organic electroluminescent element according to this embodiment is enlarged.

As shown in FIGS. 1 and 2, the organic electroluminescent element 110 includes a first electrode 10, a second electrode 20, an organic luminescent layer 40, an optical layer 50, and a planarization layer 55.

The first electrode 10 has a first major surface 10a and a second major surface 10b. The second major surface 10b is a surface on the opposite side from the first major surface 10a. The first electrode 10 has optical transparency. The first electrode 10 is e.g. a transparent electrode.

Here, the first direction perpendicular to the first major surface 10a is defined as Z-axis direction. One direction parallel to the first major surface 10a is defined as X-axis direction. The direction parallel to the first major surface 10a and perpendicular to the X-axis direction is defined as Y-axis direction. The X-axis direction and the Y-axis direction are directions perpendicular to the Z-axis direction. The Z-axis direction corresponds to the thickness direction of the first electrode 10.

The second electrode 20 is opposed to part of the first major surface 10a of the first electrode 10. The second electrode 20 has light reflectivity. The light reflectance of the second electrode 20 is higher than the light reflectance of the first electrode 10. The second electrode 20 includes a conductive section 21 (first conductive section). For instance, the conductive section 21 is provided in a plurality. The conductive section 21 has light reflectivity. The conductive section 21 is provided outside a conductive section non-formation region 22. The conductive section non-formation region 22 is defined as a region not provided with the conductive section 21 in the X-Y plane. The conductive section 21 is provided in the region except the conductive section non-formation region 22. The second electrode 20 is opposed to the first major surface 10a in the conductive section 21.

As shown in FIG. 2, the conductive section 21 is shaped like a strip extending along the Y-axis direction. The conductive sections 21 are provided in a plurality arranged in e.g. the X-axis direction. Thus, the second electrode 20 is formed in a striped pattern shape. The distance between the plurality of conductive sections 21 is e.g. constant. The pattern shape of the second electrode 20 is arbitrary.

The organic luminescent layer 40 is provided between the first major surface 10a of the first electrode 10 and the second electrode 20. For instance, the organic luminescent layer 40 recombines electrons and holes to generate excitons under a voltage applied via the first electrode 10 and the second electrode 20. The organic luminescent layer 40 emits light by e.g. utilizing luminescence resulting from radiative deactivation of the exciton.

The organic electroluminescent element 110 further includes a wiring layer 30 and a substrate 80 (first substrate). The substrate 80 has optical transparency. The substrate 80 is provided between the first electrode 10 and the optical layer 50. The wiring layer 30 and the substrate 80 are appropriately provided in the organic electroluminescent element 110, and can be omitted.

The wiring layer 30 extends e.g. along a plane parallel to the first major surface 10a. That is, the wiring layer 30 extends in the X-Y plane. In this example, the wiring layer 30 is provided on the first major surface 10a of the first electrode 10. The wiring layer 30 is provided on part 10d of the portion 10c of the first major surface 10a not overlapping the second electrode 20 as projected on the plane (X-Y plane) parallel to the first major surface 10a (as viewed in the Z-axis direction). The portion 10c not overlapping the second electrode 20 is the portion between two adjacent conductive sections 21 as projected on the X-Y plane. That is, the portion 10c not overlapping the second electrode 20 overlaps the conductive section non-formation region 22 as projected on the X-Y plane. The wiring layer 30 overlaps part of the conductive section non-formation region 22. The wiring layer 30 may be provided between the second major surface 10b of the first electrode 10 and the substrate 80. In this case, the wiring layer 30 is provided on part 10f of the portion 10e of the second major surface 10b not overlapping the second electrode 20 as projected on the X-Y plane. The first electrode 10 includes a portion not overlapping the wiring layer 30 as projected on the X-Y plane.

The wiring layer 30 includes e.g. a conductive wiring section 31. For instance, the wiring section 31 is provided in a plurality. The region not provided with the wiring section 31 is referred to as wiring section non-formation region 32. The wiring section 31 is provided outside the wiring section non-formation region 32. As projected on the X-Y plane, the wiring section non-formation region 32 overlaps part of the first electrode 10. The wiring section 31 overlaps part of the first electrode 10 as projected on the X-Y plane. The wiring layer 30 is electrically connected to the first electrode 10. The wiring layer 30 extends e.g. in the X-Y plane. The pattern shape of the wiring layer 30 is e.g. a striped shape or lattice shape.

As shown in FIG. 2, in this example, the wiring section 31 is shaped like a strip extending along the Y-axis direction. The wiring sections 31 are provided in a plurality arranged in e.g. the X-axis direction. Thus, the wiring layer 30 is formed in a striped pattern shape. The spacing between the plurality of wiring sections 31 is e.g. constant. Furthermore, the spacing between the plurality of wiring sections 31 is wider than e.g. the spacing between the plurality of conductive sections 21. In this example, for instance, one wiring section 31 is provided for every third conductive section 21. The pattern shape of the wiring layer 30 is arbitrary.

The conductivity of the wiring layer 30 is higher than the conductivity of the first electrode 10. The wiring layer 30 has light reflectivity. The wiring layer 30 is e.g. a metal wiring. The wiring layer 30 functions as e.g. an auxiliary electrode for transferring the current flowing in the first electrode 10. The wiring layer 30 exposes at least part of the first electrode 10.

The light reflectance of the wiring layer 30 is higher than the light reflectance of the first electrode 10. In this description, the state of having a light reflectance higher than the light reflectance of the first electrode 10 is referred to as light reflectivity. An insulating layer (not shown) may be provided on the upper surface and side surface of the wiring layer 30.

The light transmittance of the first electrode 10 is higher than the light transmittance of the wiring layer 30 and the light transmittance of the second electrode 20. In this description, the state of having a light transmittance higher than the light transmittance of the wiring layer 30 and the light transmittance of the second electrode 20 is referred to as optical transparency. For instance, the light transmittance of the substrate 80 is higher than the light transmittance of the second electrode 20 and the light transmittance of the wiring layer 30.

The optical layer 50 has optical transparency. The optical layer 50 has a third major surface 50a opposed to the second major surface 10b of the first electrode 10, and a fourth major surface 50b on the opposite side from the third major surface 50a. The fourth major surface 50b includes a first region 50c overlapping the second electrode 20 and a second region 50d not overlapping the second electrode 20 as projected on the X-Y plane.

The fourth major surface 50b includes a first concave-convex 51a provided in the first region 50c and a second concave-convex 51b provided in the second region 50d. The first concave-convex 51a and the second concave-convex 51b are provided e.g. on the entire surface of the fourth major surface 50b. The optical layer 50 scatters the light emitted from the organic luminescent layer 40 by the first concave-convex 51a. In this example, the first concave-convex 51a and the second concave-convex 51b are formed from a plurality of hemispherical microlenses ML arranged in a matrix. That is, the optical layer 50 is what is called a microlens sheet.

The diameter of the microlens ML is e.g. the visible light region (360 nm-780 nm) or more and 1 mm or less. The shape of the first concave-convex 51a and the shape of the second concave-convex 51b are not limited to the shape of microlenses ML, but may be an arbitrary shape.

In this example, the substrate 80 is provided between the first electrode 10 and the optical layer 50. On the substrate 80, the first electrode 10 is formed. The second major surface 10b of the first electrode 10 is opposed to the substrate 80. For instance, an adhesive layer 52 is provided between the optical layer 50 and the substrate 80. For instance, the optical layer 50 is stuck to the substrate 80 via the adhesive layer 52. For instance, the optical layer 50 changes the traveling direction of the light emitted from the organic luminescent layer 40. For instance, the optical layer 50 scatters the light. This improves e.g. the light extraction efficiency in the organic electroluminescent element 110. Here, the adhesive layer 52 may be an adhesive agent developing peeling resistance by solidification, or a tackiness agent containing high viscosity liquid or gel solid.

The planarization layer 55 is provided on the second region 50d of the optical layer 50. In this example including the wiring layer 30, the planarization layer 55 is provided on the portion 50e of the second region 50d not overlapping the wiring layer 30 as projected on the X-Y plane. That is, at least part of the planarization layer 55 does not overlap the second electrode 20 and the wiring layer 30 in the Z-axis direction. In this example, the planarization layer 55 is formed in e.g. a striped pattern shape.

The planarization layer 55 buries the second concave-convex 51b of the optical layer 50. For instance, the planarization layer 55 planarizes the second concave-convex 51b. The surface 55s of the planarization layer 55 is more planar than the first concave-convex 51a. The positional variation in the Z-axis direction of the surface 55s is smaller than the depth of the first concave-convex 51a. The depth of the first concave-convex 51a refers to the distance along the Z-axis direction between the vertex 51p of the first concave-convex 51a and the bottom 51q of the first concave-convex 51a. The refractive index of the planarization layer 55 is substantially equal to the refractive index of the optical layer 50. That is, the degree of change of the traveling direction (e.g., light scattering capability) of light passing through the planarization layer 55 is smaller than the degree of change of the traveling direction (e.g., light scattering capability) of light passing through the first concave-convex 51a.

The refractive index of the optical layer 50 is preferably close to that of the substrate 80. The refractive index of the optical layer 50 is e.g. 1.3 or more and 2.0 or less. The refractive index of the planarization layer 55 is e.g. 1.3 or more and 2.0 or less. The refractive index of the optical layer 50 is denoted by n1. The refractive index of the planarization layer 55 is denoted by n2. Then, the absolute value of the difference between n1 and n2 is e.g. 0.15 or less.

Figure 3:
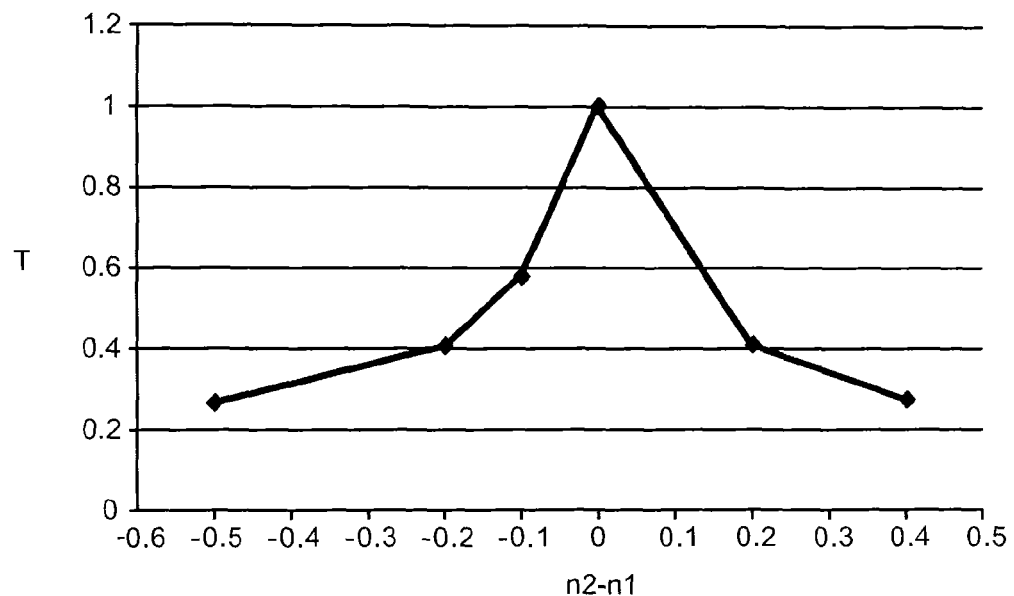
FIG. 3 is a graph illustrating the characteristics of the organic electroluminescent element according to the first embodiment.

FIG. 3 is a graph illustrating the characteristics of the organic electroluminescent element according to the first embodiment.

FIG. 3 is a graph showing the result of determining the refractive index difference between n2 and n1 by optical simulation. In FIG. 3, the horizontal axis represents the refractive index difference n2−n1. The vertical axis represents the light transmittance T.

As shown in FIG. 3, as the result of the optical simulation, in the case where the absolute value of the refractive index difference is set to 0.15 or less, the light transmittance T is 50% or more. Thus, the absolute value of the difference between n1 and n2 is preferably 0.15 or less. This can provide a favorable light transmittance in the portion of the planarization layer 55. Here, in the optical simulation, it is assumed that the optical layer 50 is made of a plurality of microlenses having a diameter of 30 μm and arranged like a lattice. It is assumed that the planarization layer 55 has a striped pattern shape. The width in the X-axis direction of the part 55a of the planarization layer 55 formed like a strip was set to 100 μm. The spacing in the X-axis direction between the two nearest parts 55a was set to 900 μm. The refractive index n1 of the optical layer 50 (microlens) was set to 1.5. The refractive index n2 of the planarization layer 55 was arbitrarily varied to obtain the result of the graph shown in FIG. 3.

In the organic electroluminescent element 110, the organic luminescent layer 40 in the portion where the first electrode 10 and the second electrode 20 (conductive section 21) are opposed to each other constitutes a luminescent region 44. The luminescence light 45 emitted from the luminescent region 44 passes through the first electrode 10, the substrate 80, and the optical layer 50 and is emitted to the outside of the organic electroluminescent element 110. Part of the luminescence light 45 is reflected by the second electrode 20 and emitted to the outside through the first electrode 10, the substrate 80, and the optical layer 50. Part of the luminescence light 45 is emitted to the outside through the planarization layer 55. If light reaches the first concave-convex 51a not covered with the planarization layer 55, the course of the luminescence light 45 is changed by the first concave-convex 51a. This reduces e.g. the light returning to the inside of the organic electroluminescent element 110 by total reflection, and improves the light extraction efficiency. That is, the luminescence efficiency of the organic electroluminescent element 110 is improved.

In the organic electroluminescent element 110, the external light 46 incident from the outside passes through the conductive section non-formation region 22, the organic luminescent layer 40, the wiring section non-formation region 32 of the wiring layer 30, the first electrode 10, the substrate 80, the optical layer 50, and the planarization layer 55. Thus, the organic electroluminescent element 110 transmits the external light 46 incident on the organic electroluminescent element 110 from the outside while emitting the luminescence light 45. Thus, the organic electroluminescent element 110 partly has optical transparency. Part of the organic electroluminescent element 110 is e.g. transparent. The organic electroluminescent element 110 allows a background image to be viewed through the transparent part of the organic electroluminescent element 110. That is, the organic electroluminescent element 110 is a see-through light source shaped like a thin film or plate.

For instance, in the case of the configuration lacking the planarization layer 55, the external light 46 passing therethrough is scattered by the second concave-convex 51b. This decreases the transparency of the organic electroluminescent element. In contrast, in the organic electroluminescent element 110, the external light 46 passes through the planarization layer 55. Thus, the external light 46 passing through the organic electroluminescent element 110 is not substantially scattered. This improves the transparency of the organic electroluminescent element 110.

In the conductive section 21 and the wiring section 31, the external image may be subjected to specular reflection. For instance, the observer's own image is reflected by the conductive section 21 and the wiring section 31, and the reflected image is viewed by the observer. That is, the reflected image of the external image is generated. This significantly degrades the viewability of the background image. In the organic electroluminescent element 110, the first concave-convex 51a is exposed at the position overlapping the conductive section 21 having light reflectivity as projected on the X-Y plane. Furthermore, the second concave-convex 51b is exposed at the position overlapping the wiring section 31 having light reflectivity as projected on the X-Y plane. Thus, the specular reflection light by the conductive section 21 and the wiring section 31 is scattered. This suppresses viewing of the reflected image of the external image.

Thus, the first concave-convex 51a and the second concave-convex 51b change the traveling direction of the light emitted from the organic luminescent layer 40. The first concave-convex 51a and the second concave-convex 51b scatter the light reflected by the conductive section 21 and the wiring section 31. In the X-Y plane, the optical layer 50 scatters the external light 46 incident on the region overlapping at least one of the conductive section 21 and the wiring section 31. The portion of the organic electroluminescent element 110 provided with the planarization layer 55 is substantially transparent as projected on the X-Y plane.

Thus, the organic electroluminescent element 110 of the embodiment can provide a transmissive organic electroluminescent element. This organic electroluminescent element has high luminescence efficiency and high transparency. Application of this organic electroluminescent element 110 to a lighting apparatus enables various new applications by the function of transmitting the background image besides the illumination function.

Figure 4:
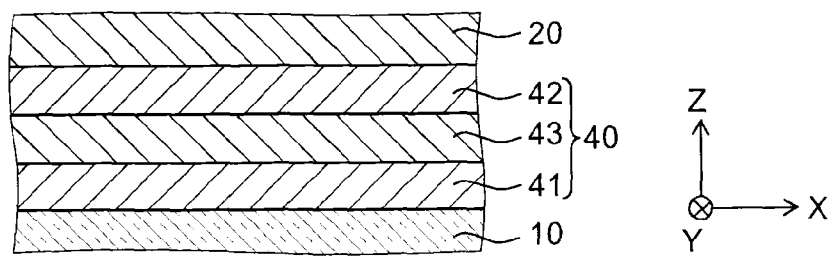
FIG. 4 is a schematic sectional view illustrating the configuration of part of the organic electroluminescent element according to the first embodiment.

FIG. 4 is a schematic sectional view illustrating the configuration of part of the organic electroluminescent element according to the first embodiment.

As shown in FIG. 4, the organic luminescent layer 40 includes a luminescent section 43. As necessary, the organic luminescent layer 40 further includes at least one of a first layer 41 and a second layer 42. The luminescent section 43 emits light including a wavelength of visible light. The first layer 41 is provided between the luminescent section 43 and the first electrode 10. The second layer 42 is provided between the luminescent section 43 and the second electrode 20.

The luminescent section 43 can be made of a material such as $Alq_3$ (tris(8-hydroxyquinolinolato) aluminum), F8BT (poly(9,9-dioctylfluorene-co-benzothiadiazole)), and PPV (poly(para-phenylene vinylene)). The luminescent section 43 can be made of a mixed material including a host material and a dopant added to the host material. The host material can be e.g. CBP (4,4'-N,N'-dicarbazolyl-biphenyl), BCP (2,9-dimethyl-4,7-diphenyl-1,10-phenanthroline), TPD (2,9-dimethyl-4,7-diphenyl-1,10-phenanthroline), PVK (poly(vinyl carbazole)), and PPT (poly(3-phenylthiophene)). The dopant material can be e.g. Flrpic (iridium(III) bis[(4,6-difluorophenyl)pyridinato-N,$C^{2'}$]picolinate), Ir(ppy)$_3$ (tris(2-phenylpyridine)iridium), and Flr6 (bis(2,4-difluorophenyl)pyridinato tetrakis(1-pyrazolyl)borate iridium(III)).

The first layer 41 functions as e.g. a hole injection layer. The first layer 41 functions as e.g. a hole transport layer. The first layer 41 may have a stacked structure of a layer functioning as a hole injection layer and a layer functioning as a hole transport layer. The first layer 41 may include a layer different from the layer functioning as a hole injection layer and the layer functioning as a hole transport layer.

The second layer 42 can include a layer functioning as e.g. an electron injection layer. The second layer 42 can include a layer functioning as e.g. an electron transport layer. The second layer 42 may have a stacked structure of the layer functioning as an electron injection layer and the layer functioning as an electron transport layer. The second layer 42 may include a layer different from the layer functioning as an electron injection layer and the layer functioning as an electron transport layer.

For instance, the organic luminescent layer 40 emits light including a wavelength component of visible light. For instance, the light emitted from the organic luminescent layer 40 is substantially white light. That is, the light emitted from the organic electroluminescent element 110 is white light. Here, the "white light" is substantially white, and also includes e.g. reddish, yellowish, greenish, bluish, and purplish white light.

The first electrode 10 contains e.g. an oxide containing at least one element selected from the group consisting of In, Sn, Zn, and Ti. The first electrode 10 can be made of e.g. indium oxide, zinc oxide, tin oxide, indium tin oxide (ITO), fluorine-doped tin oxide (FTO), or a film fabricated by using a conductive glass containing indium zinc oxide (e.g., NESA), gold, platinum, silver, and copper. The first electrode 10 functions as e.g. an anode.

The second electrode 20 contains e.g. at least one of aluminum and silver. For instance, the second electrode 20 is made of an aluminum film. Furthermore, the second electrode 20 may be made of an alloy of silver and magnesium. This alloy may be doped with calcium. The second electrode 20 functions as e.g. a cathode.

The wiring layer 30 contains e.g. at least one element selected from the group consisting of Mo, Ta, Nb, Al, Ni, and Ti. The wiring layer 30 can be e.g. a mixed film containing an element selected from this group. The wiring layer 30 can be a stacked film containing these elements. The wiring layer 30 can be e.g. a stacked film of Nb/Mo/Al/Mo/Nb. The wiring layer 30 functions as e.g. an auxiliary electrode for suppressing the voltage drop of the first electrode 10. The wiring layer 30 can function as a lead electrode for current supply.

The optical layer 50 can be made of e.g. acrylic resin, epoxy resin, polyethylene terephthalate, or polypropylene. The planarization layer 55 is made of e.g. a photosensitive resin. The photosensitive resin can be e.g. acrylic resin or polyimide resin. The substrate 80 can be e.g. a glass substrate or resin substrate.

Figure 5A:
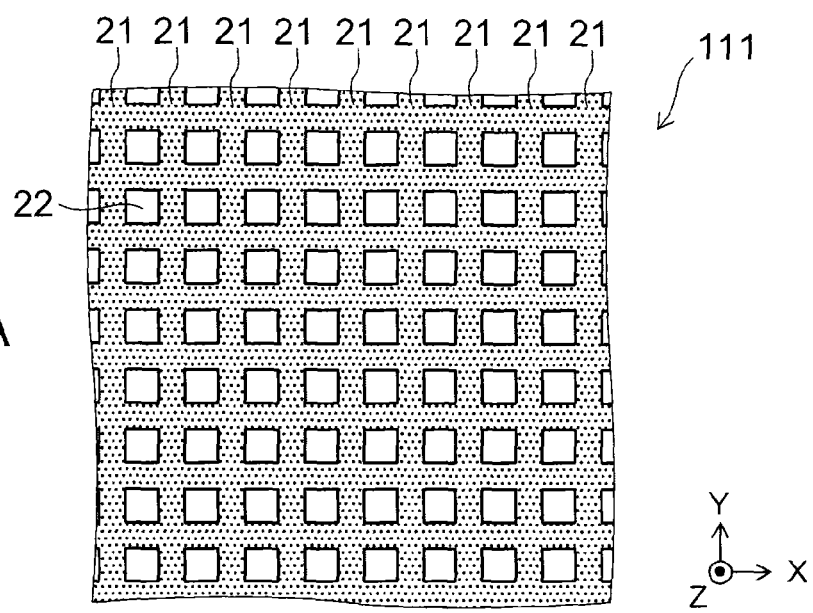
FIGS. 5A and 5B are schematic plan views illustrating the configuration of part of an alternative organic electroluminescent element according to the first embodiment.
Figure 5B:
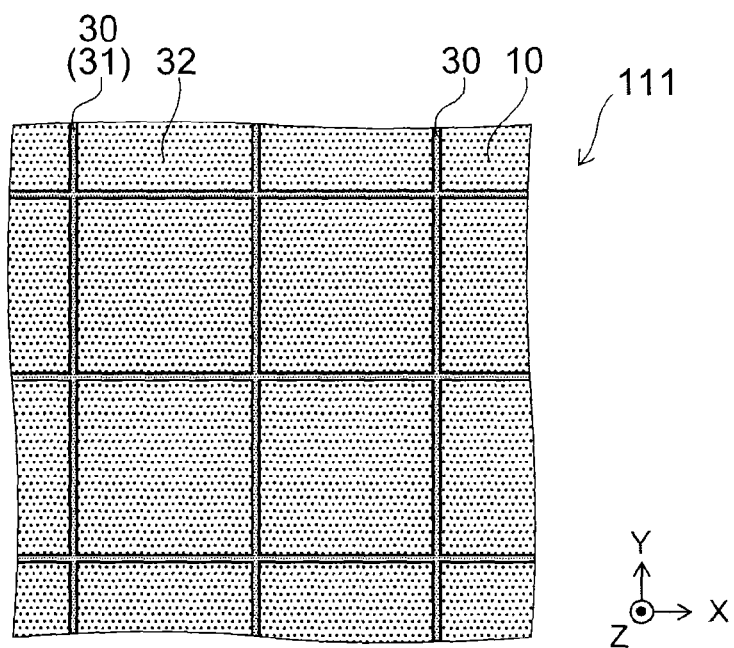

FIGS. 5A and 5B are schematic plan views illustrating the configuration of part of an alternative organic electroluminescent element according to the first embodiment.

FIG. 5A shows an example of the pattern shape of the second electrode 20 of the organic electroluminescent element 111 according to this embodiment. FIG. 5B shows an example of the pattern shape of the wiring layer 30 of the organic electroluminescent element 111.

As shown in FIG. 5A, in the organic electroluminescent element 111, the second electrode 20 (conductive section 21) is shaped like a lattice. The conductive section 21 (second conductive section) has a lattice pattern shape. In this example, the conductive section non-formation region 22 provided in the second electrode 20 is shaped like a quadrangle (rectangle). However, the shape of the conductive section non-formation region 22 is not limited to the quadrangle, but is arbitrary. For instance, the lattice pattern shape of the second electrode 20 may be a honeycomb shape.

As shown in FIG. 5B, the wiring layer 30 (wiring section 31) is shaped like a lattice. In this example, the wiring section non-formation region 32 provided in the wiring layer 30 is shaped like a quadrangle (rectangle). However, the shape of the wiring section non-formation region 32 is not limited to the quadrangle, but is arbitrary. For instance, the shape of the wiring section non-formation region 32 may be adapted to the shape of the conductive section non-formation region 22.

Figure 6:
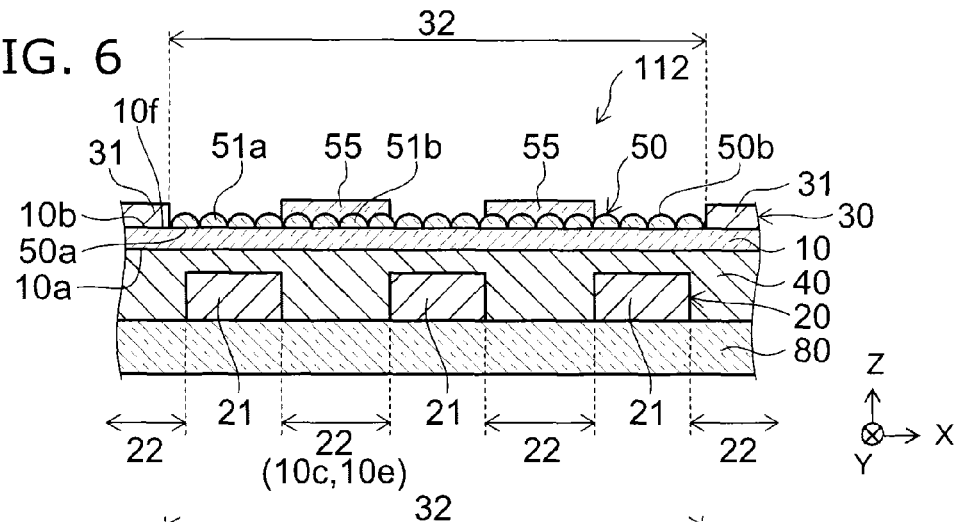
FIG. 6 is a schematic sectional view illustrating the configuration of an alternative organic electroluminescent element according to the first embodiment.

FIG. 6 is a schematic sectional view illustrating the configuration of an alternative organic electroluminescent element according to the first embodiment.

FIG. 6 is a sectional view corresponding to e.g. the cross section taken along line A1-A2 of FIG. 2.

As shown in FIG. 6, in the alternative organic electroluminescent element 112 according to this embodiment, the second electrode 20 is provided on the substrate 80 (second substrate). The organic luminescent layer 40 is provided on the second electrode 20. The first electrode 10 is provided on the organic luminescent layer 40. The wiring layer 30 is provided on the second major surface 10b of the first electrode 10. In this example, the wiring layer 30 is provided on part 10f of the portion 10e of the second major surface 10b not overlapping the second electrode 20 as projected on the X-Y plane. The optical layer 50 is provided on the portion of the second major surface 10b corresponding to the wiring section non-formation region 32. The planarization layer 55 is provided on the portion 50e of the fourth major surface 50b of the optical layer 50 not overlapping the second electrode 20 and the wiring layer 30 as projected on the X-Y plane.

The organic electroluminescent element 112 can also provide an organic electroluminescent element having optical transparency. That is, the organic electroluminescent element may be of the top emission type emitting light toward above the substrate 80, or the bottom emission type emitting light toward below the substrate 80. The wiring layer 30 may be provided on the organic luminescent layer 40, and the first electrode 10 may be provided on the wiring layer 30. In the organic electroluminescent element 112, for instance, before forming the organic luminescent layer 40, the second electrode 20 can be formed on the substrate 80. Thus, in the organic electroluminescent element 112, the second electrode 20 is formed more easily than in e.g. the organic electroluminescent element 110. For instance, in the organic electroluminescent element 112, the second electrode 20 can be made narrower than in the organic electroluminescent element 110. Furthermore, for instance, in the organic electroluminescent element 112, the second electrode 20 is curved in a wavy shape. Thus, for instance, the light reflected by the second electrode travels in various directions. Accordingly, the light distribution of the organic electroluminescent element 112 can be made uniform.

Figure 7:
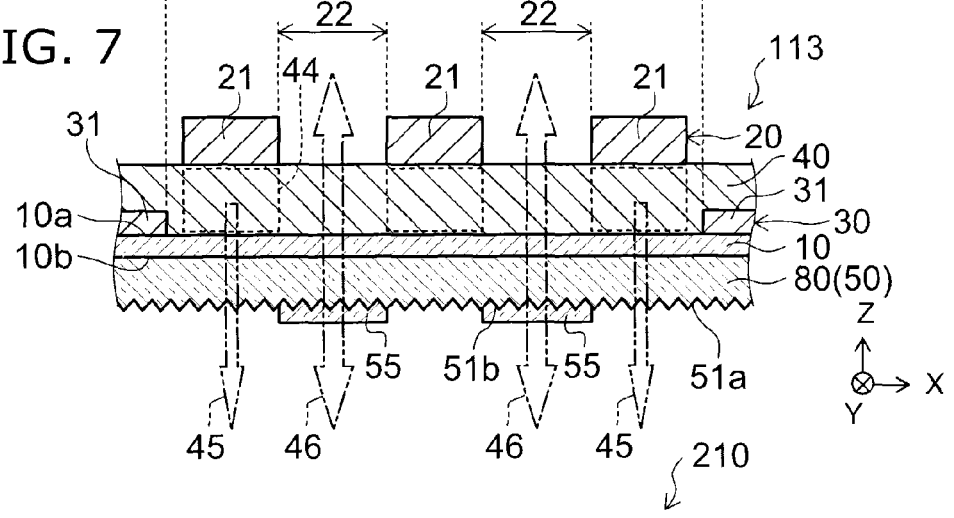
FIG. 7 is a schematic sectional view illustrating the configuration of an alternative organic electroluminescent element according to the first embodiment.

FIG. 7 is a schematic sectional view illustrating the configuration of an alternative organic electroluminescent element according to the first embodiment.

As shown in FIG. 7, in the alternative organic electroluminescent element 113 according to the first embodiment, the first concave-convex 51a and the second concave-convex 51b are provided on the entire surface of the substrate 80 on the opposite side from the first electrode 10. That is, in the organic electroluminescent element 113, the optical layer 50 is formed from the substrate 80. The first concave-convex 51a and the second concave-convex 51b of the substrate 80 can be formed by e.g. the frost treatment. Thus, also by using the substrate 80 as the optical layer 50, an organic electroluminescent element 113 having high luminescence efficiency and high transparency can be provided.

In the configuration using e.g. a microlens sheet for the optical layer 50, the optical layer 50 may be dissolved e.g. in forming the planarization layer 55. In the organic electroluminescent element 113, the adverse effect on the optical layer 50 (substrate 80) due to the formation of the planarization layer 55 can be suppressed as compared with the configuration using e.g. a microlens sheet for the optical layer 50. Thus, the organic electroluminescent element 113 can be manufactured more easily than e.g. the organic electroluminescent element 110. For instance, more types of solvents and the like can be used.

(Second Embodiment)

Figure 8:
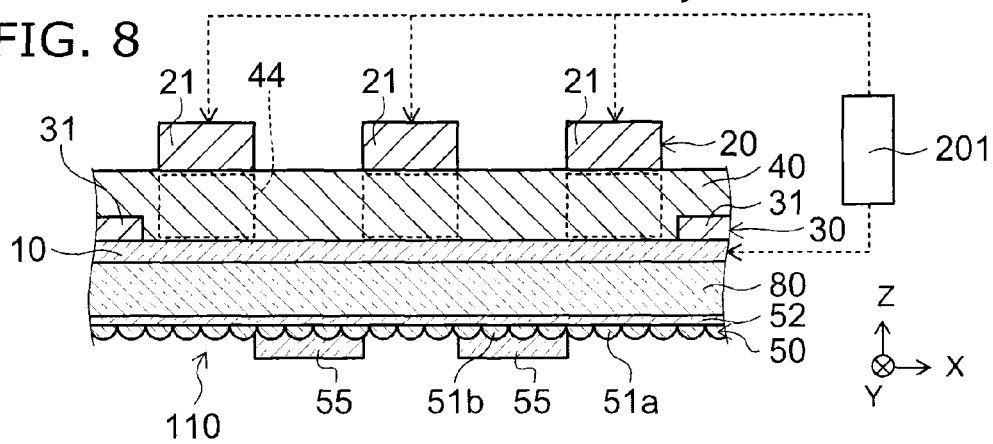
FIG. 8 is a schematic view illustrating the configuration of a lighting apparatus according to a second embodiment.

FIG. 8 is a schematic view illustrating the configuration of a lighting apparatus according to a second embodiment.

As shown in FIG. 8, the lighting apparatus 210 according to this embodiment includes the organic electroluminescent element according to the first embodiment (e.g., organic electroluminescent element 110) and a power supply section 201.

The power supply section 201 is electrically connected to the first electrode 10 and the second electrode 20. The power supply section 201 supplies current to the organic luminescent layer 40 through the first electrode 10 and the second electrode 20.

The lighting apparatus 210 according to this embodiment can provide a lighting apparatus having high luminescence efficiency and high transparency.

(Third Embodiment)

This embodiment relates to a method for manufacturing an organic electroluminescent element. This embodiment corresponds to part of a method for manufacturing a lighting apparatus.

FIGS. 9A to 9E are sequential schematic sectional views illustrating the method for manufacturing an organic electroluminescent element according to a third embodiment.

Figure 9A:
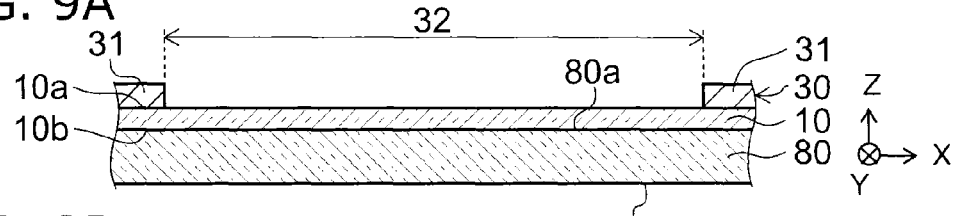
FIGS. 9A to 9E are sequential schematic sectional views illustrating the method for manufacturing an organic electroluminescent element according to a third embodiment.

As shown in FIG. 9A, for instance, on a substrate 80, a first electrode 10 is formed. The substrate 80 has a first surface 80a and a second surface 80b. The first electrode 10 is formed on the first surface 80a. A wiring layer 30 is formed on the first electrode 10. The pattern of the wiring layer 30 is formed by using e.g. photolithography and etching. Alternatively, film formation (such as evaporation) using a mask may be used.

Figure 9B:
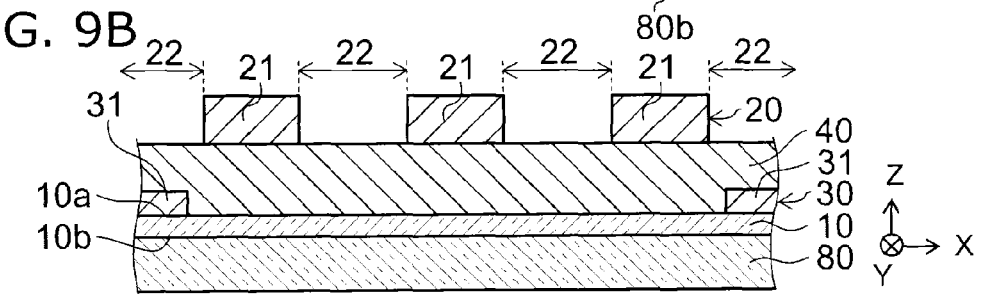

As shown in FIG. 9B, an organic luminescent layer 40 is formed on the first electrode 10 and the wiring layer 30. A second electrode 20 is formed on the organic luminescent layer 40. The pattern of the second electrode 20 is formed by using e.g. photolithography and etching. Alternatively, film formation (such as evaporation) using a mask may be used.

Figure 9C:
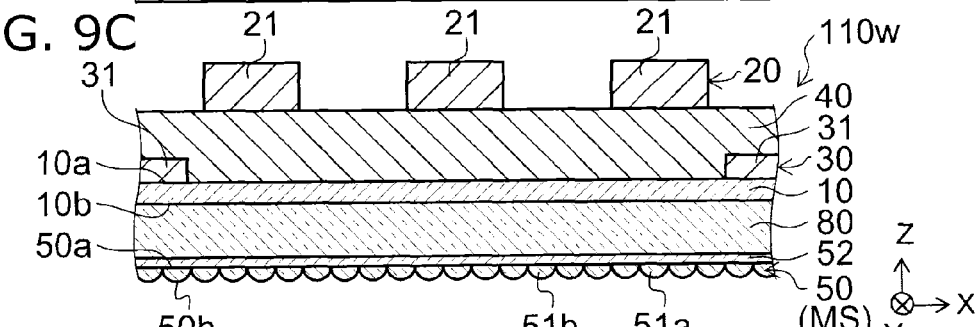

As shown in FIG. 9C, an optical layer 50 is formed on the second surface 80b of the substrate 80 by e.g. sticking a microlens sheet MS via an adhesive layer 52. Thus, a workpiece 110w is formed. In the method of sticking a microlens sheet MS, the optical layer 50 can be easily formed.

Figure 9D:
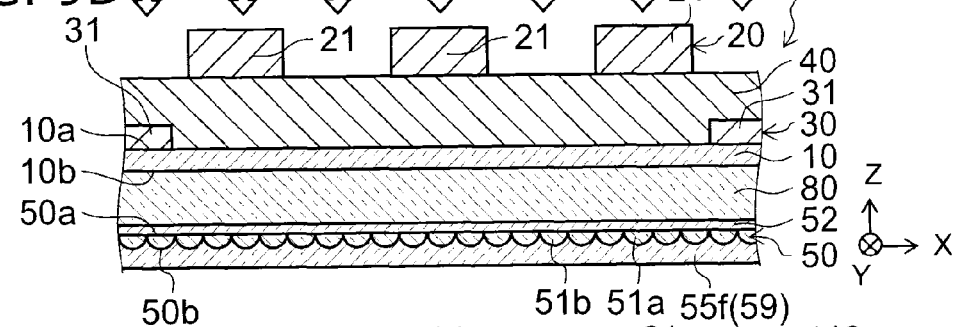

As shown in FIG. 9D, a planarization film 55f constituting a planarization layer 55 is formed on the fourth major surface 50b of the optical layer 50. For instance, the planarization film 55f covers the first concave-convex 51a and the second concave-convex 51b of the optical layer 50. Thus, the planarization film 55f is formed so as to bury the first concave-convex 51a and the second concave-convex 51b. That is, the film thickness of the planarization film 55f is made equal to or thicker than the height of the first concave-convex 51a and the height of the second concave-convex 51b. The planarization film 55f is e.g. a photosensitive resin film 59. The photosensitivity of the resin film 59 in this example is photocurability. In this example, the resin film 59 is of the negative type in which the portion irradiated with light is cured. The planarization film 55f can be formed by e.g. a method such as coating or printing using a raw material liquid such as a solution of the resin film 59. For instance, spin coating, gravure printing, meniscus printing, capillary printing, and slit coating can be used.

Exposure light 75 is applied from above the upper surface of the workpiece 110w. The exposure light 75 is light for causing the resin film 59 to develop photosensitivity. This exposure light 75 is blocked by the second electrode 20 (conductive section 21) and the wiring layer 30. That is, the second electrode 20 and the wiring layer 30 are used as a mask. Of the exposure light 75, the light passing through the conductive section non-formation region 22 and the wiring section non-formation region 32 is applied to the planarization film 55f. Thus, a pattern reflecting the pattern shape of the second electrode 20 and the wiring layer 30 is formed in the resin film 59. Accordingly, the planarization film 55f is processed by light exposure. In the case of lacking the wiring layer 30, the second electrode 20 is used as a mask. The resin film 59 is processed into a pattern reflecting the pattern shape of the second electrode 20.

Figure 9E:
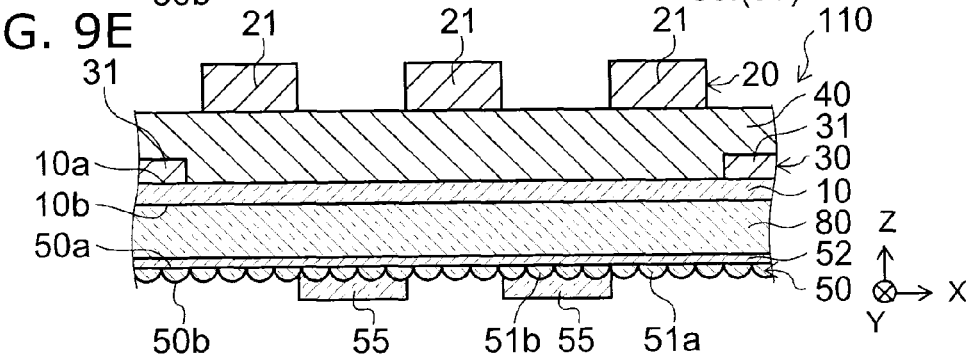

As shown in FIG. 9E, the portion of the planarization film 55f not irradiated with light is removed. Thus, a planarization layer 55 can be formed from the resin film 59. Consequently, the organic electroluminescent element 110 is completed.

In this example, the planarization layer 55 is formed in self-alignment with the second electrode 20 and the wiring layer 30. The shape of the planarization layer 55 substantially overlaps the shape of the second electrode 20 and the wiring layer 30. Thus, high processing accuracy is achieved. Furthermore, this method can easily fabricate the planarization layer 55. Here, the organic electroluminescent element 110 has been used for description. However, the organic electroluminescent element is not limited thereto. For instance, the organic electroluminescent element 112 shown in FIG. 6 and the organic electroluminescent element 113 shown in FIG. 7 can also be used to form a planarization layer 55 in self-alignment with the second electrode 20 and the wiring layer 30.

Figure 10A:
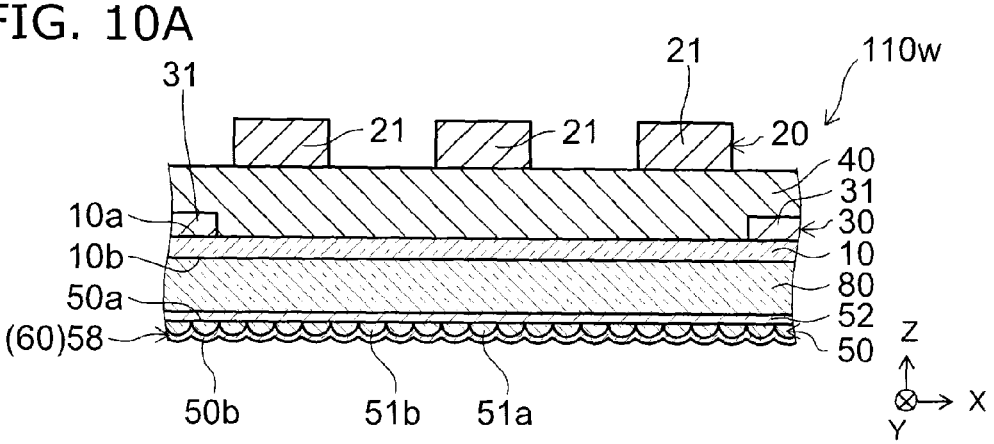
FIGS. 10A to 10C are sequential schematic sectional views illustrating an alternative method for manufacturing an organic electroluminescent element according to the third embodiment.
Figure 10B:
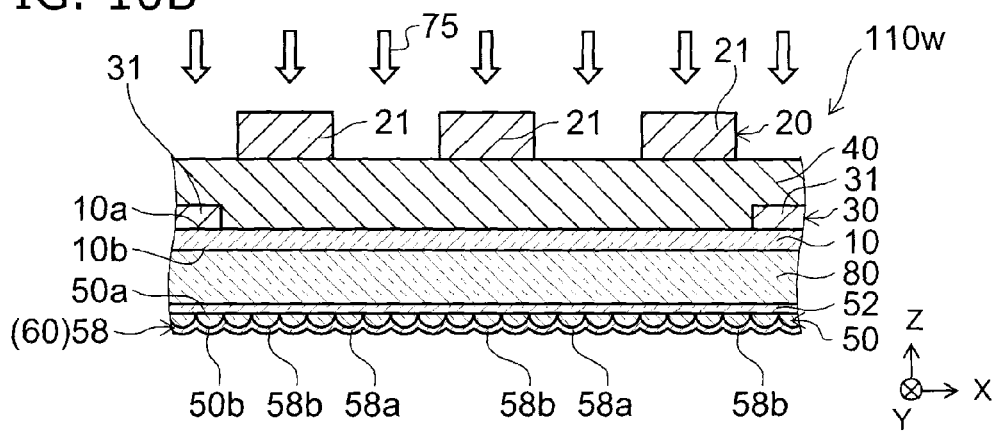
Figure 10C:
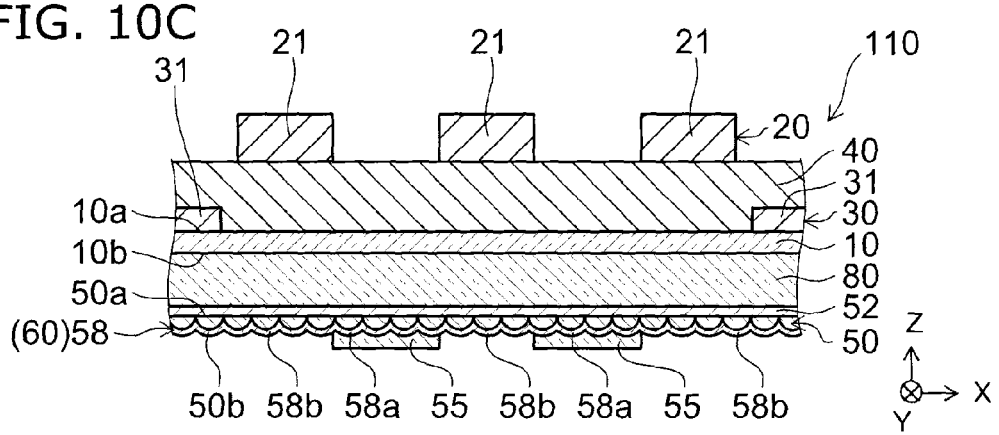

FIGS. 10A to 10C are sequential schematic sectional views illustrating an alternative method for manufacturing an organic electroluminescent element according to the third embodiment.

As shown in FIG. 10A, for instance, after forming a workpiece 110w, a surface modification layer 58 is formed on the fourth major surface 50b of the optical layer 50. The workpiece 110w can be formed by substantially the same procedure as described with reference to FIGS. 9A to 9C. As the surface modification layer 58, a photosensitive surface film 60 is formed. In the photosensitive surface film 60, the surface energy is changed by light irradiation. The surface film 60 can be made of e.g. a coupling agent. For instance, the surface energy changes with the type of functional groups contained in the coupling agent. The surface film 60 can be formed by e.g. spin coating, spraying, dipping, roll coating, printing, and mist deposition.

As shown in FIG. 10B, exposure light 75 is applied from above the upper surface of the workpiece 110w. The second electrode 20 and the wiring layer 30 are used as a mask to irradiate the surface film 60 with the exposure light 75. Thus, the surface modification layer 58 is formed. The surface modification layer 58 has a pattern with different surface energies reflecting the pattern shape of the second electrode 20 and the wiring layer 30. In the surface modification layer 58, the region irradiated with the exposure light 75 is referred to as irradiation region 58a. The surface energy of the irradiation region 58a is made relatively higher than the surface energy of the region not irradiated with the exposure light 75.

As shown in FIG. 10C, a planarization layer 55 is formed on the surface modification layer 58. A raw material liquid constituting the planarization layer 55 is applied onto the surface modification layer 58 by an arbitrary method. The raw material liquid on the non-irradiation region 58b is repelled. The raw material liquid on the irradiation region 58a is left. The raw material liquid is cured by heating or light irradiation. Thus, the planarization layer 55 is selectively formed. Accordingly, the organic electroluminescent element 110 is completed.

In this example, the planarization layer 55 is formed in self-alignment with the second electrode 20 and the wiring layer 30. The shape of the planarization layer 55 substantially overlaps the shape of the second electrode 20 and the wiring layer 30. Thus, high processing accuracy is achieved. Furthermore, this method can easily fabricate the planarization layer 55. Furthermore, for instance, the step of removing the portion not irradiated with light can be omitted. Compared with the case of using a photocurable resin film 59, the manufacturing process can be further simplified. For instance, in the case of not using a solvent for removing part of the resin film 59, high environmental friendliness is achieved. Here, the organic electroluminescent element 110 has been used for description. However, the organic electroluminescent element is not limited thereto. For instance, the organic electroluminescent element 112 shown in FIG. 6 and the organic electroluminescent element 113 shown in FIG. 7 can also be used to form a planarization layer 55 in self-alignment with the second electrode 20 and the wiring layer 30.

Figure 11:
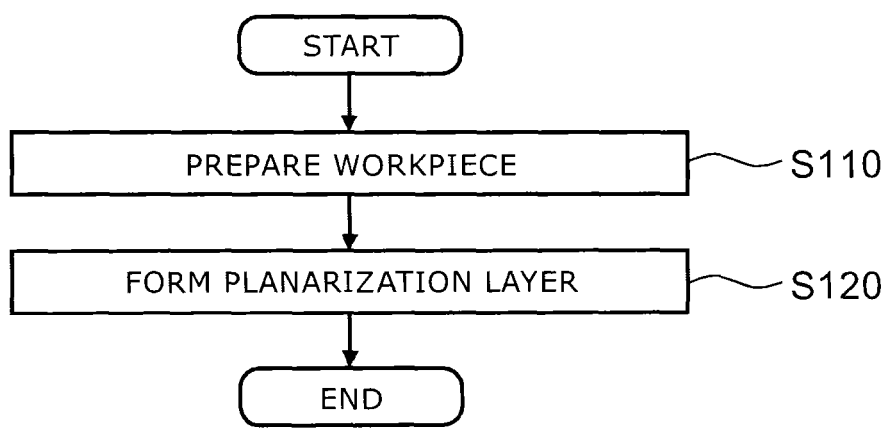
FIG. 11 is a flow chart illustrating the method for manufacturing an organic electroluminescent element according to the third embodiment.

FIG. 11 is a flow chart illustrating the method for manufacturing an organic electroluminescent element according to the third embodiment.

As shown in FIG. 11, the method for manufacturing the organic electroluminescent element 110 according to the embodiment includes a step S110 of preparing a workpiece 110w and a step S120 of forming a planarization layer 55. The step S120 of forming a planarization layer 55 can further include e.g. forming a photosensitive resin film 59 and forming a planarization layer 55 from the resin film 59 by light exposure using the second electrode 20 as a mask.

In the step S110, for instance, the processing described with reference to FIGS. 9A to 9C is performed. In the step S120, for instance, the processing described with reference to FIGS. 9D and 9E or FIGS. 10A to 10C is performed.

Thus, the organic electroluminescent element 110 having optical transparency is efficiently manufactured. This organic electroluminescent element has high luminescence efficiency and high transparency.

The embodiments provide an organic electroluminescent element, a lighting apparatus, and a method for manufacturing an organic electroluminescent element having optical transparency.

The embodiments of the invention have been described above with reference to examples. However, the embodiments of the invention are not limited to these examples. For instance, any specific configurations of various components such as the first electrode, second electrode, organic luminescent layer, optical layer, planarization layer, wiring layer, workpiece, and resin film included in the organic electroluminescent element, and the power supply section included in the lighting apparatus are encompassed within the scope of the invention as long as those skilled in the art can similarly practice the invention and achieve similar effects by suitably selecting such configurations from conventionally known ones.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An organic electroluminescent element comprising:
a first electrode having a first major surface and a second major surface on opposite side from the first major surface and having optical transparency;
a second electrode opposed to part of the first major surface;
an organic luminescent layer provided between the first electrode and the second electrode;
an optical layer having a third major surface opposed to the second major surface and a fourth major surface on opposite side from the third major surface and having optical transparency, the fourth major surface including a first region overlapping the second electrode and a second region not overlapping the second electrode as projected on a plane parallel to the first major surface, and the fourth major surface including a first concave-convex provided in the first region and a second concave-convex provided in the second region; and
a planarization layer provided on the second region and burying the second concave-convex.

2. The element according to claim 1, wherein the planarization layer has a surface more planar than the first concave-convex.

3. The element according to claim 1, wherein absolute value of difference between refractive index of the planarization layer and refractive index of the optical layer is 0.15 or less.

4. The element according to claim 1, further comprising:
a wiring layer having a higher conductivity than the first electrode and provided on part of a portion of the first major surface not overlapping the second electrode as projected on the plane, the wiring layer being electrically connected to the first electrode,
wherein the planarization layer is provided on a portion of the second region not overlapping the wiring layer as projected on the plane.

5. The element according to claim 1, further comprising:
a wiring layer having a higher conductivity than the first electrode and provided on part of a portion of the second major surface not overlapping the second electrode as projected on the plane, the wiring layer being electrically connected to the first electrode,
wherein the planarization layer is provided on a portion of the second region not overlapping the wiring layer as projected on the plane.

6. The element according to claim 1, wherein the second electrode includes a plurality of first conductive sections extending along one direction parallel to the first major surface and arranged in another direction parallel to the first major surface and perpendicular to the one direction.

7. The element according to claim 1, wherein the second electrode includes a second conductive section having a lattice pattern shape.

8. The element according to claim 1, further comprising:
a first substrate having optical transparency and provided between the first electrode and the optical layer.

9. The element according to claim 8, further comprising:
an adhesive layer provided between the optical layer and the first substrate.

10. The element according to claim 1, further comprising:
a second substrate having optical transparency, the second electrode being provided on the second substrate,
wherein the organic luminescent layer is provided on the second electrode,
the first electrode is provided on the organic luminescent layer, and
the optical layer is provided on the first electrode.

11. The element according to claim 1, wherein the first concave-convex and the second concave-convex are hemispherical microlenses.

12. The element according to claim 11, wherein the microlens has a diameter of 360 nm or more and 1 mm or less.

13. The element according to claim 1, wherein the first electrode contains an oxide containing at least one element selected from the group consisting of In, Sn, Zn, and Ti.

14. The element according to claim 1, wherein the second electrode contains at least one of aluminum and silver.

15. A lighting apparatus comprising:
an organic electroluminescent element including:
a first electrode having a first major surface and a second major surface on opposite side from the first major surface and having optical transparency;
a second electrode opposed to part of the first major surface;
an organic luminescent layer provided between the first electrode and the second electrode;
an optical layer having a third major surface opposed to the second major surface and a fourth major surface on opposite side from the third major surface and having optical transparency, the fourth major surface including a first region overlapping the second electrode and a second region not overlapping the second electrode as projected on a plane parallel to the first major surface, and the fourth major surface including a first concave-convex provided in the first region and a second concave-convex provided in the second region; and a planarization layer provided on the second region and burying the second concave-convex; and a power supply section electrically connected to the first electrode and the second electrode and supplying current to the organic luminescent layer through the first electrode and the second electrode.

16. A method for manufacturing an organic electroluminescent element, comprising:

forming a planarization layer on a workpiece, the workpiece including a first electrode, a second electrode, an organic luminescent layer, and an optical layer, the first electrode having optical transparency and having a first major surface and a second major surface on opposite side from the first major surface, the second electrode being opposed to part of the first major surface, the organic luminescent layer being provided between the first electrode and the second electrode, the optical layer having optical transparency and having a third major surface opposed to the second major surface and a fourth major surface on opposite side from the third major surface, the fourth major surface including a first region overlapping the second electrode and a second region not overlapping the second electrode as projected on a plane parallel to the first major surface, and the fourth major surface including a first concave-convex provided in the first region and a second concave-convex provided in the second region, the forming including forming the planarization layer burying the second concave-convex on the second region by processing the workpiece based on light exposure using the second electrode as a mask.

17. The method according to claim 16, wherein the forming the planarization layer further includes:

forming a resin film having photosensitivity on the fourth major surface so as to cover the first concave-convex and the second concave-convex; and forming the planarization layer from the resin film by applying light causing the resin film to develop the photosensitivity using the second electrode as a mask.

18. The method according to claim 16, further comprising:

forming the workpiece, wherein the forming the workpiece includes:

forming the first electrode on a first surface of a first substrate having the first surface and a second surface on opposite side from the first surface;

forming the organic luminescent layer on the first electrode;

forming the second electrode on the organic luminescent layer; and forming the optical layer on the second surface.

19. The method according to claim 18, wherein the forming the optical layer includes sticking a microlens sheet including a plurality of hemispherical microlenses to the second surface.

20. The method according to claim 16, wherein the forming the planarization layer further includes:

forming a photosensitive surface film changing surface energy by light irradiation on the fourth major surface;

irradiating the surface film with the light changing the surface energy using the second electrode as a mask; and forming the planarization layer by applying a raw material liquid constituting the planarization layer onto the surface film and leaving the raw material liquid only on an irradiation region of the surface film irradiated with the light.

* * * * *